US012557653B2

(12) United States Patent  
Flynn et al.

(10) Patent No.: US 12,557,653 B2  
(45) Date of Patent: Feb. 17, 2026

(54) PACKAGE ASSEMBLY WITH THERMAL INTERFACE MATERIAL GUTTER

(71) Applicant: Advanced Micro Devices, Inc., Santa Clara, CA (US)

(72) Inventors: Michael Flynn, Santa Clara, CA (US); Otto Joe, Santa Clara, CA (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 507 days.

(21) Appl. No.: 18/099,949

(22) Filed: Jan. 22, 2023

(65) Prior Publication Data

US 2024/0249996 A1 Jul. 25, 2024

(51) Int. Cl.
| | |
|---|---|
| H01L 23/42 | (2006.01) |
| H01L 21/48 | (2006.01) |
| H01L 23/00 | (2006.01) |
| H01L 23/367 | (2006.01) |
| H01L 25/065 | (2023.01) |

(52) U.S. Cl.
CPC .......... *H01L 23/42* (2013.01); *H01L 21/4817* (2013.01); *H01L 23/3675* (2013.01); *H01L 24/16* (2013.01); *H01L 24/73* (2013.01); *H01L 25/0655* (2013.01); *H01L 2224/16225* (2013.01); *H01L 2224/73253* (2013.01); *H01L 2924/15311* (2013.01)

(58) Field of Classification Search
CPC . H01L 23/42; H01L 23/3675; H01L 21/4817; H01L 24/16; H01L 24/73; H01L 25/0655; H01L 2224/16225; H01L 2224/73253; H01L 2924/15311
See application file for complete search history.

(56) References Cited

U.S. PATENT DOCUMENTS

| | | | |
|---|---|---|---|
| 7,863,093 B2 | 1/2011 | Ronen | |
| 8,334,591 B2 | 12/2012 | Kusano | |
| 8,659,169 B2 | 2/2014 | Mardi et al. | |
| 8,901,732 B2 | 12/2014 | Yew et al. | |
| 9,673,119 B2 | 6/2017 | Lin et al. | |
| 9,812,374 B1 | 11/2017 | Refai-Ahmed et al. | |
| 10,043,730 B2 | 8/2018 | Refai-Ahmed et al. | |
| 10,163,754 B2 | 12/2018 | Ho et al. | |
| 10,262,920 B1 | 4/2019 | Refai-Ahmed et al. | |
| 10,529,645 B2 | 1/2020 | Gandhi et al. | |
| 2014/0268342 A1 | 9/2014 | Matsushita | |
| 2018/0350754 A1* | 12/2018 | Huang | H01L 25/0655 |
| 2018/0358280 A1* | 12/2018 | Gandhi | H01L 23/04 |
| 2021/0305227 A1* | 9/2021 | Chen | H01L 25/18 |

* cited by examiner

*Primary Examiner* — Peniel M Gumedzoe  
(74) *Attorney, Agent, or Firm* — Patterson + Sheridan, LLP

(57) ABSTRACT

A method and apparatus are provided which manages the movement of thermal interface material (TIM) squeezed out from between a lid and an IC die of an IC (chip) package. In one embodiment, a chip package is provided that includes an IC die mounted on a substrate and covered by a lid. A bottom surface of the lid has a die overlapped region facing a top surface of the IC die. The bottom surface of the lid has a first gutter formed therein. An outer sidewall of the first gutter is formed outward of the first die overlapped region as to receive TIM squeezed out from between a lid and an IC die.

23 Claims, 6 Drawing Sheets

PACKAGE ASSEMBLY WITH THERMAL INTERFACE MATERIAL GUTTER

BACKGROUND

Field

Embodiments of the present disclosure generally relate to a chip package, and in particular, to chip package comprising at least one integrated circuit (IC) die covered by a lid, the lid having features for controlling the spread of thermal interface material.

Description of the Related Art

Electronic devices, such as tablets, computers, copiers, digital cameras, smart phones, control systems and automated teller machines, among others, often employ electronic components which leverage chip packages for increased functionality and higher component density. Conventional chip packaging schemes often utilize package substrates, often in conjunction with a through-silicon-via (TSV) interposer, to enable a plurality of integrated circuit (IC) dies to be mounted to a single substrate. The IC dies may include memory, logic or other IC device.

In many instances, a lid is utilized to substantially cover one or more of the dies. The lid is part of the packaging of the IC structure. The lid can be formed of a plastic, metal or other suitable material, and is mounted to the die and interposer or package substrate using an adhesive, such as a heat transfer paste or other suitable bonding material. The lid functions to protect the die from damage, such as from impact from another object or from ultraviolet light which might damage the die.

A thermal interface material (TIM) is often used between the lid and IC die to promote heat transfer therebetween. TIM generally has a heat transfer material having a conductivity of at least about 0.3 W/m·K. Examples of TIM include thermal grease, thermally conductive epoxy, phase change materials, conductive tapes, and silicone-coated fabrics among other suitable materials. TIM is typically soft and compliant to allow good thermal contact between the IC die and the lid even when uneven topography is present.

Since TIM can expand out from between the IC die and lid due to compressive stress as well as exposure to high temperatures, the TIM may contact unintended areas. For example, by leaving the area between the lid and IC die, TIM become debris that can spread into the socket and onto general printed circuit board components. This can be problematic with large enough debris sizes or if the TIM are electrically conductive, which can short routings and/or surface mounted components disposed on the printed circuit board or within the chip package itself. Since utilizing sufficient amounts of TIM is required to achieve full contact area coverage between the lid and IC die, unintended spreading of TIM is difficult to avoid.

Therefore, a need exists for an improved chip package, and in particular, a chip package having a lid that includes improved features for control of TIM spreading.

SUMMARY

A method and apparatus are provided which manages the movement of thermal interface material (TIM) squeezed out from between a lid and an IC die of an IC (chip) package. In one embodiment, a chip package is provided that includes an IC die mounted on a substrate and covered by a lid. A bottom surface of the lid has a die overlapped region facing a top surface of the IC die. The bottom surface of the lid has a first gutter formed therein. An outer sidewall of the first gutter is formed outward of the first die overlapped region as to receive TIM squeezed out from between a lid and an IC die.

In another embodiment, a chip package is provided that includes a first IC die, a substrate, and a lid. The IC die coupled to the substrate. The first IC die has a top surface bounded by edges. The lid includes a top surface and a bottom surface. The bottom surface faces away from the top surface and towards the first IC die. The bottom surface of the lid has a first die overlapped region facing a top surface of the first IC die. The bottom surface of the lid has a first gutter formed therein. At least a portion of the first gutter is aligned in a common direction with at least one of the edges of the top surface of the first IC die. An outer sidewall of the first gutter is formed outward of the first die overlapped region.

In another embodiment, a chip package is provided that includes a first IC die, a substrate, and a lid. The IC die coupled to the substrate. The first IC die has a top surface bounded by edges. The lid includes a top surface and a bottom surface. The bottom surface faces away from the top surface and towards the first IC die. The bottom surface of the lid has a first gutter and a plurality of grooves formed therein. The first gutter has a depth that is at least an order of magnitude greater than a depth of the plurality of grooves. An outer sidewall of the first gutter formed outward of the first die overlapped region.

In yet another embodiment, a method for forming a chip package is provided. The method including mounting an IC die to a substrate; and sandwiching thermal interface material between a lid and the IC die. The lid includes a top surface and a bottom surface. The bottom surface of the lid facing away from the top surface and towards the IC die, and having a die overlapped region facing a top surface of the IC die. The bottom surface of the lid has a gutter formed therein. At least a portion of the gutter is aligned in a common direction with at least one edge of the top surface of the IC die. An outer sidewall of the gutter is formed outward of the die overlapped region and immediately adjacent the top surface of the IC die. The gutter is positioned to receive thermal interface material squeezed out from between the lid and the IC die.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements of one embodiment may be beneficially incorporated in other embodiments.

DETAILED DESCRIPTION

Embodiments of the disclosure generally provide a chip package having one or more integrated circuit (IC) dies covered by a lid. The lid includes features that enhance control of movement of thermal interface material (TIM) out from between the lid and the IC die. Advantageously, the good heat transfer is maintained between the IC die and the lid while reducing the probability of TIM coming in contact with a printed circuit board (PCB) to which the chip package is mounted. Contamination due to the presence of TIM outside of the lid to IC die contact area is reduced through the use of a gutter formed in the lid. The gutter helps reduce the spread of TIM from outside of desired areas (i.e., the area between the lid and the IC die) by granting room for the TIM expand as the containing assemblies are compressed and/or when the TIM is heated during use or through exposure to hot ambient environments. The gutter provides a passive geometry that is cost effective to implement, and substantially eliminates the need for precise TIM application and careful and costly post time deposition manual clean up procedures.

Figure 1:
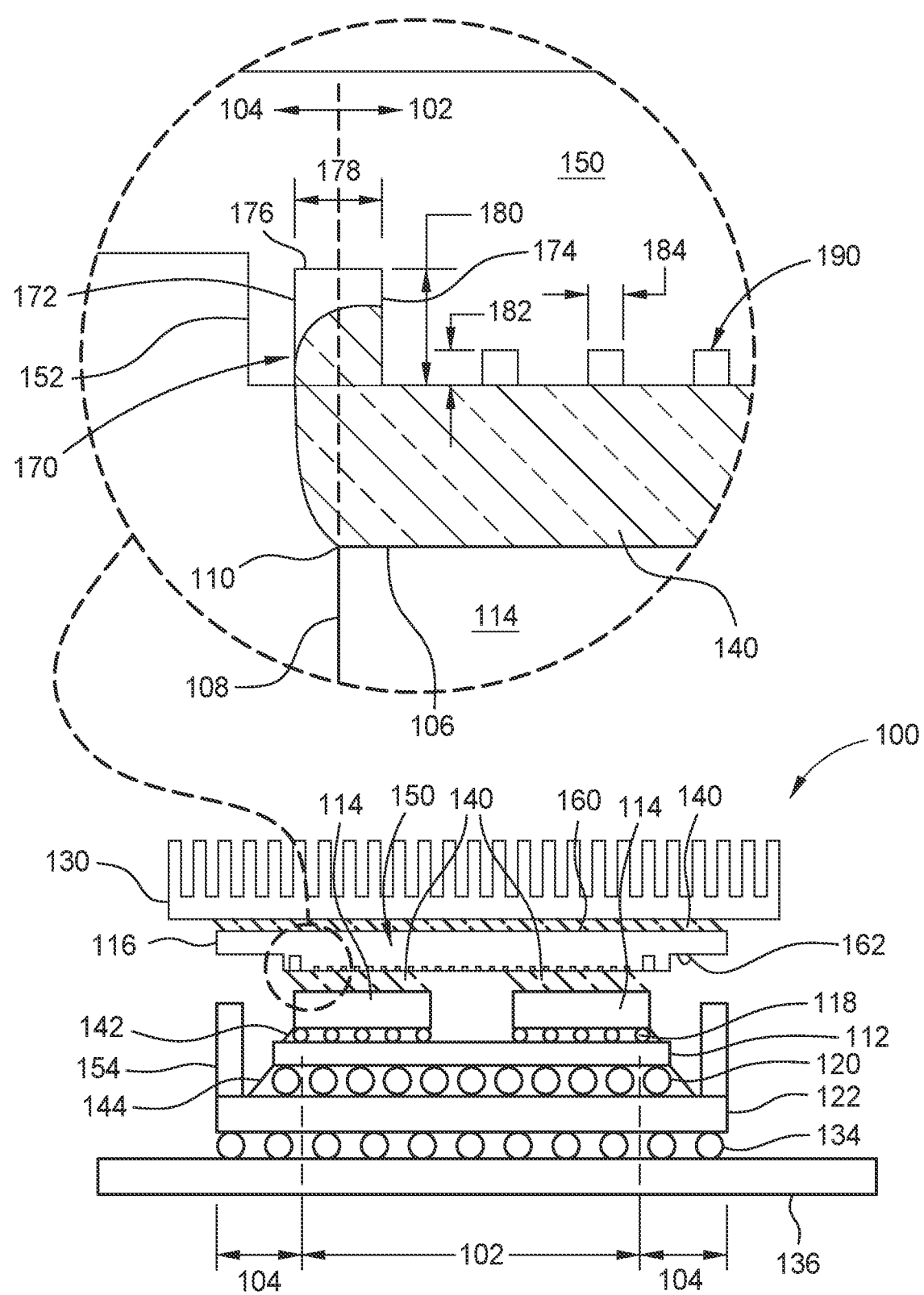
FIG. 1 is a cross sectional schematic view of an integrated chip package including one or more IC dies covered by a lid, with an enlargement detailing a gutter formed in the lid.

Turning now to FIG. 1, an exemplary integrated chip package 100 is schematically illustrated. The chip package 100 includes at least one or more IC dies 114 connected optionally by a silicon-through-via (TSV) interposer 112 to a package substrate 122. In examples where an interposer 112 is not present, the one or more IC dies 114 may be mounted directly to the package substrate 122. Although two IC dies 114 are shown in FIG. 1, the number of IC dies may range from one to as many as can be fit within the chip package 100.

The interposer 112 includes circuitry for electrically connecting the IC dies 114 to circuitry of the package substrate 122. The circuitry of the interposer 112 may optionally include transistors. Package bumps 120, also known as "C4 bumps," are utilized to provide an electrical connection between the circuitry of the interposer 112 and the circuitry of the package substrate 122. The package substrate 122 may be mounted and connected to a printed circuit board (PCB) 136, utilizing solder balls 134, wire bonding or other suitable technique. An undermolding 144 may be utilized to fill the space not taken by the package bumps 120 between the PCB 136 and the interposer 112, thereby providing structural rigidity to the chip package 100.

The IC dies 114 are mounted to one or more surfaces of the interposer 112, or alternatively in embodiments wherein an interposer is not utilized, to the package substrate 122. The IC dies 114 may be programmable logic devices, such as field programmable gate arrays (FPGA), memory devices, optical devices, processors or other IC logic structures. Optical devices include photo-detectors, lasers, optical sources, and the like. In the embodiment depicted in FIG. 1, the IC dies 114 are mounted to a top surface of the interposer 112 by a plurality of micro-bumps 118. The micro-bumps 118 electrically connect the circuitry of each IC die 114 to circuitry of the interposer 112. The circuitry of the interposer 112 connects the micro-bumps 118 to selective package bumps 120, and hence, connects selective circuitry of each IC die 114 to the package substrate 122, to enable communication of the IC dies 114 with the PCB 136 after the chip package 100 is mounted within an electronic device (not shown). When the optional interposer 112 is not present, the micro-bumps 118 connects selective circuitry of each IC die 114 to the package substrate 122 to enable communication of the IC dies 114 with the PCB 136. An undermolding 142 may be utilized to fill the space not taken by the micro-bumps 118 between the IC dies 114 and interposer 112 to provide structural rigidity to the chip package 100.

The chip package 100 additionally includes a stiffener 154. The stiffener 154 is coupled to the package substrate 122 and circumscribes the IC dies 114. The stiffener 154 can extend to peripheral edges of the package substrate 122 to provide mechanical support which helps prevent the chip package 100 from bowing and warpage. The stiffener 154 may be a single layer structure or a multi-layer structure. The stiffener 154 may be made of ceramic, metal or other various inorganic materials, such as aluminum oxide ($Al_2O_3$), aluminum nitride (AlN), silicon nitride (SiN), silicon (Si), copper (Cu), aluminum (Al), and stainless steel, among other materials. The stiffener 154 can also be made of organic materials such as copper-clad laminate.

A lid 150 is disposed over a top surface 106 of the IC dies 114. To promote heat transfer to the lid 150 from the IC dies 114, the lid 150 is fabricated from a thermally conductive material, such as copper, aluminum, copper-clad aluminum, nickel-plated copper or aluminum, among other suitable materials. The lid 150 may have a thickness of between about 0.5 mm and about 3.0 mm, although other thicknesses may be utilized.

The lid 150 has a top surface 160 and a bottom surface 162 that are connected by an outer sidewall 116. The outer sidewall 116 forms the outer extents of the lid 150. The top surface 160 forms the exterior top surface of the chip package 100, while the bottom surface 162 faces the IC dies 114. A heat sink, not shown, may optionally be mounted to the top surface 160 of the lid 150. In other examples, the lid 150 may serve as a heat sink incorporating active and/or passive heat transfer devices, some of which are discussed below with reference to FIGS. 6-8. Active heat transfer devices that may be incorporated with the lid 150 include a thermoelectric heat pump, such as a Peltier cooler, and a forced liquid heat exchanger, among other suitable active heat transfer device. Passive heat transfer devices that may be incorporated with the lid 150 include a heat pipe, a vapor cavity, and fins, among other suitable passive heat transfer device.

Optionally, a heatsink 130 may be disposed over the lid 150 to enhance thermal control of the IC dies 114 within the chip package 100. The heatsink 130 may incorporate active and/or passive heat transfer devices, such as discussed below with reference to the lids shown in FIGS. 6-8. Active heat transfer devices that may be incorporated with the heatsink 130 include a thermoelectric heat pump, such as a Peltier cooler, and a forced liquid heat exchanger, among other suitable active heat transfer device. Passive heat transfer devices that may be incorporated with the heatsink 130 include a heat pipe, a vapor cavity, and fins, among other suitable passive heat transfer device. Thermal interface material (TIM) 140 may be disposed between the lid 150 and heatsink to enhance heat transfer therebetween.

Continuing to refer to FIG. 1, the lid 150 is disposed over the IC dies 114. The bottom surface 162 of the lid 150 includes a die overlapped region 102 and an outer region 104. As the name infers, the die overlapped region 102 is the region of the bottom surface 162 of the lid 150 that is directly over the IC die 114, while outer region 104 extends from a sidewall 108 of the IC die 114 closest to the outer sidewall 116 of the lid 150 to the outer sidewall 116 of the lid 150. The demarcation between the die overlapped region 102 and the outer region 104 is illustrated by a dashed line that projects from the sidewall 108 of the IC die 114 through the edge 110 defined where the top surface 106 and sidewall 108 of the IC die 114 meet.

The bottom surface 162 of the lid 150 may optionally include a pad 152 that projects from the bottom surface 162 away from the top surface 160 and towards the IC die 114. Most of the pad 152 resides in the die overlapped region 102 of the bottom surface 162. In FIG. 1, one pad 152 resides over all the IC dies 114 of the chip package 100. Alternatively, one pad 152 may reside one or more of the IC dies 114 of the chip package 100, while one or more other pads 152 may reside one or more other IC dies 114 of the chip package 100.

The bottom surface 162 additionally includes at least one gutter 170 that is configured to control the spread of thermal interface material (TIM) 140. The TIM 140 is utilized to thermally and/or mechanically couple the lid 150 to the IC dies 114. The TIM 140 provides a thermally conductive path between the lid 150 to the IC dies 114 so that heat generated by the IC dies 114 may be more readily conducted from the IC dies 114 to the lid 150 and out of the chip package 100.

The TIM 140 is generally a heat transfer material having a conductivity of at least about 0.3 W/m·K. Examples of materials suitable for use the TIM 140 includes thermal grease, thermally conductive epoxy, phase change materials, conductive tapes, and silicone-coated fabrics among other suitable materials. The TIM 140 may be a soft or compliant adhesive to allow compensation between mismatched heights of neighboring IC dies 114 within the chip package 100. In one example, the TIM 140 may be a thermal gel or thermal epoxy, such as for example, packaging component attach adhesives available from AI Technology, Inc., located in Princeton Junction, New Jersey. In another example, the TIM 140 may be a applying phase change material, such as Laird PCM 780.

The gutter 170 is generally a groove formed in the bottom surface 162 of the lid 150. The gutter 170 includes an outer sidewall 172 and an inner sidewall 174 that are connected by a bottom 176 of the groove. Although the gutter 170 is shown as having a rectangular sectional profile, other profiles may be utilized. In embodiments where the profile of the gutter 170 is not rectangular, the outer and inner sidewalls 172, 174 may be considered as where the inner and outer (relative to the outer sidewall 116 of the lid 150) edges of the gutter 170 intersects the bottom surface 162 of the lid 150.

Figure 2:
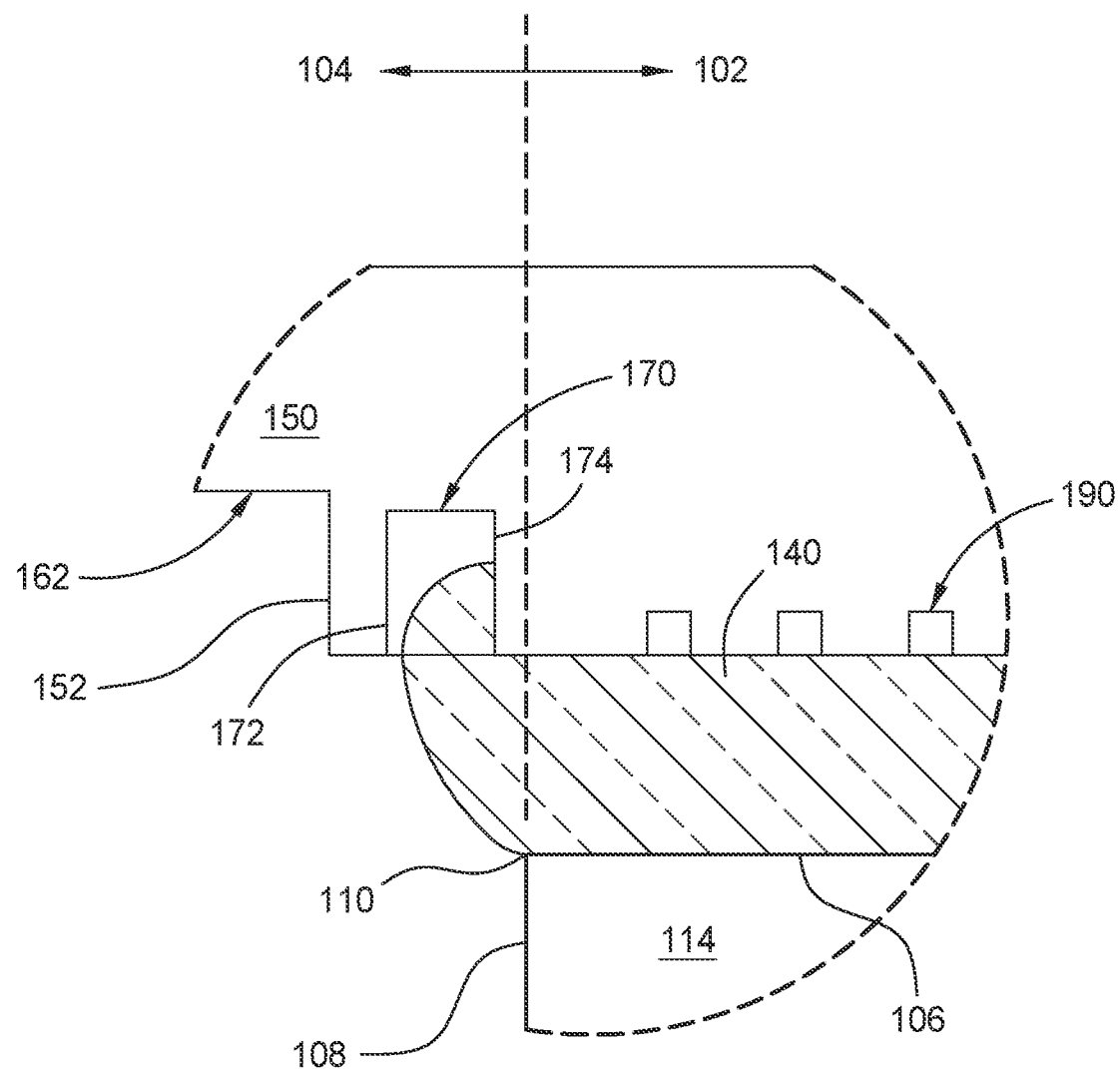
FIG. 2 is a partial sectional view of an interface between the lid and the IC of the integrated chip package of FIG. 1 illustrating an alternative location of the gutter formed in the lid.

At least a portion of the gutter 170 resides in the outer region 104 of the bottom surface 162 of the lid 150. The gutter 170 includes a portion that runs parallel to the outer sidewall 116 of the IC die 114. In the example depicted in FIG. 1, the outer sidewall 172 of the gutter 170 is outward of the die overlapped region 102 of the bottom surface 162, while the inner sidewall 174 resides within the die overlapped region 102. Stated differently, the outer and inner sidewalls 172, 174 of the gutter 170 straddles at least one sidewall 108 of the IC die 114 that is closest (relative to other sidewalls 108) the nearest sidewall 116 of the lid 150. Alternatively, as depicted in FIG. 2, both the outer and inner sidewalls 172, 174 of the gutter 170 are outward of the die overlapped region 102 of the bottom surface 162. Stated differently, the outer and inner sidewalls 172, 174 of the gutter 170 illustrated in FIG. 2 are outward of at least one sidewall 108 of the IC die 114, and reside in the outer region 104 of the bottom surface 162 of the lid 150.

In the examples depicted in FIGS. 1 and 2, the gutter 170 is formed in the optional pad 152 of the lid 150. However, in other examples of lids 150 that do not include the optional pad 152, the gutter 170 is formed on a planar bottom surface 162 of the lid 150.

Referring back to FIG. 1, the bottom surface 162 of the lid 150 may optionally include engineered features 190 which improve the interface between the lid 150 and the TIM 140. The engineered features 190 are formed on the pad 152 (when a pad 152 is present). The engineered features 190 may enhance the adhesion between the lid 150 and the TIM 140. Increased adhesion between the lid 150 and the TIM 140 helps maintain the lid 150 firmly attached to the chip package 100. Alternatively or in addition increasing the adhesion between the lid 150 and the TIM 140, the engineered features 190 may enhance the rate of heat transfer between the lid 150 and the TIM 140. Increased heat transfer between the lid 150 and TIM 140 helps maintain the temperature of the IC die 114, which in turn improves device performance and helps maintain performance uniformity between different chip packages.

The engineered feature 190 is generally a predefined structure formed in or on the bottom surface 162 of the lid 150. For example, a predefined structure may be formed with a predefined geometry, such as cross-sectional area, height (or depth), width and pitch between structure. The engineered features 190 may be formed in a predefined pattern, for example, a pattern of structures that are spaced at regular and repeating intervals.

The engineered features 190 function to increase the surface area of the lid 150 that is in contact with the TIM 140. The increased surface area improves the adhesion between the lid 150 and the TIM 140, thus reducing the potential of the lid 150 delaminating from the chip package 100. Moreover, the increased surface area improves heat transfer between the lid 150 and the TIM 140, thus improving the performance of the IC die 114.

In one embodiment, such as shown in the enlarged portion of FIG. 1, the engineered features 190 are in the form of recesses formed in the bottom surface 162 of the lid 150. The each recess may be a blind hole, dimple, groove or have another suitable geometric form. The engineered features 190 may be in the form of intersecting grooves, a grid, spiral, close packed array or other arrangement. The engineered features 190 may have a circular, rectangular, hexagonal or other cross sectional profile. In the embodiment illustrated in FIG. 1, sidewalls of the engineered features 190 are shown as being perpendicular to the bottom surface 162 of the lid 150, such that the engineered features 190 have a width 184.

The engineered features 190 also have a depth 182. A cross sectional area (i.e., width 184 times depth 182) of the profile of the engineered features 190 is generally more than an order of magnitude less than a cross sectional area (i.e., width 178 times depth 180) of the profile of the gutter 170. This difference in profile cross sectional area is generally because the engineered features 190 function for adhesion and/or increasing thermal conduction, while the gutter 170 serves to collect excess TIM 140 that might extrude out from between the IC die 114 and the lid 150.

Figure 3:
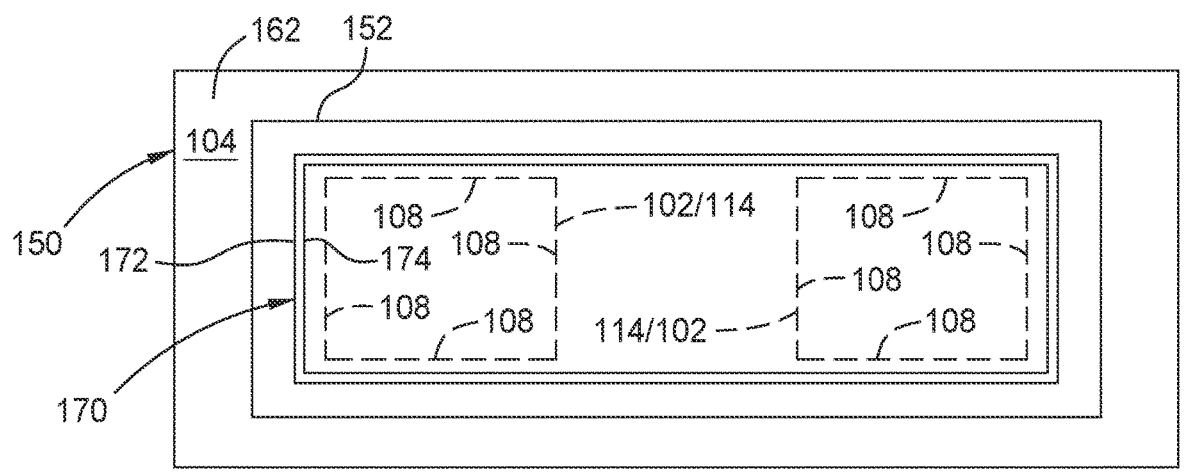
FIGS. 3-4 are bottom views of different embodiments of a lid that can be used in the integrated chip package of FIG. 1 illustrating different exemplary locations of the gutter formed in the lid.
Figure 4:
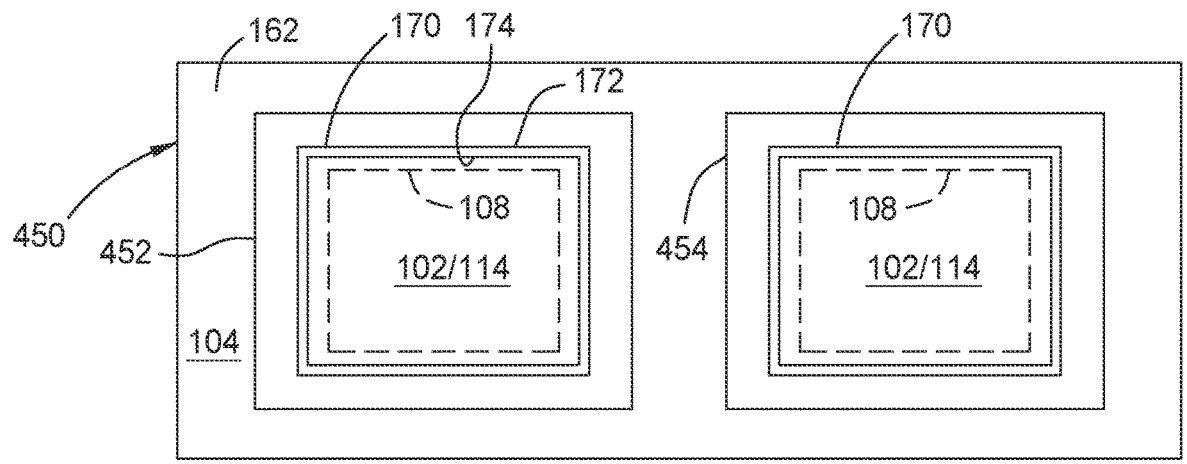

FIGS. 3-4 are bottom views of different embodiments of lids that can be used in the integrated chip package 100 of FIG. 1 illustrating different exemplary locations of the gutter 170 formed in the lid. In FIGS. 3-4, the IC dies 114 are shown with dashed lines that correspond to the die overlapped regions 102 defined on the bottom surface 162 of the lids.

Referring first to FIG. 3, the gutter 170 is formed in the lid 150 outward of at least two IC dies 114 and their corresponding die overlapped regions 102. Although only two IC dies 114 and corresponding die overlapped regions 102 are illustrated in FIG. 3, more than two IC dies 114 and corresponding die overlapped regions 102 may be circumscribed by a single gutter 170. The gutter 170 may be formed on a singular pad 152 that accommodates the IC dies 114, or when a pad is not utilized, the gutter 170 may be formed on a planar bottom surface 162 of the lid 150.

The gutter 170 generally includes a portion that follows the sidewall 108 of the IC die 114 that is closest (relative to other sidewalls 108) the nearest sidewall 116 of the lid 150. The portion of the gutter 170 that follows the sidewall 108 of the IC die 114 is generally, but not required to be, parallel to and immediately outward of the sidewall 108 of the IC die 114. In FIG. 3, portions of the gutter 170 follow three sidewalls 108 of the IC dies 114, but the gutter 170 does not pass between of the IC dies 114. Although the gutter 170 is illustrated in FIG. 3 as having the inner sidewall 174 outward of the sidewall 108 of the IC die 114, the inner sidewall 174 may alternatively be disposed inward of the sidewall 108 while the outer sidewall 172 remains outward of the sidewall 108 of the IC die 114, such as shown in the enlargement of FIG. 1.

In FIG. 4, a lid 450 is illustrated that may be used in place of the lid 150 in the chip package 100 of FIG. 1. The lid 450 includes at least two gutters 170. Each gutter 170 is formed in the lid 150 outward of at least one IC die 114 and its corresponding die overlapped region 102. Although only two IC dies 114 and corresponding die overlapped regions 102 are illustrated in FIG. 3, more than two IC dies 114 and corresponding die overlapped regions 102 may be circumscribed by each gutter 170. Each gutter 170 may be formed on a separate pad 452, 454 extending from the bottom surface 162 of the lid 450 that accommodates separate IC dies 114, or when a pad is not utilized, each gutter 170 may be formed on a planar bottom surface 162 of the lid 450. Two pads 152, 454 are illustrated in FIG. 4, but the number of pads are generally less than or equal to the number of IC dies 114 disposed beneath the lid 150.

In FIG. 4, each gutter 170 follows the four sidewalls 108 of its corresponding IC die 114, and passes between of the IC dies 114. Although the gutter 170 is illustrated in FIG. 4 as having the inner sidewall 174 outward of the sidewall 108 of the IC die 114, the inner sidewall 174 may alternatively be disposed inward of the sidewall 108 while the outer sidewall 172 remains outward of the sidewall 108 of the IC die 114, such as shown in the enlargement of FIG. 1.

Figure 5:
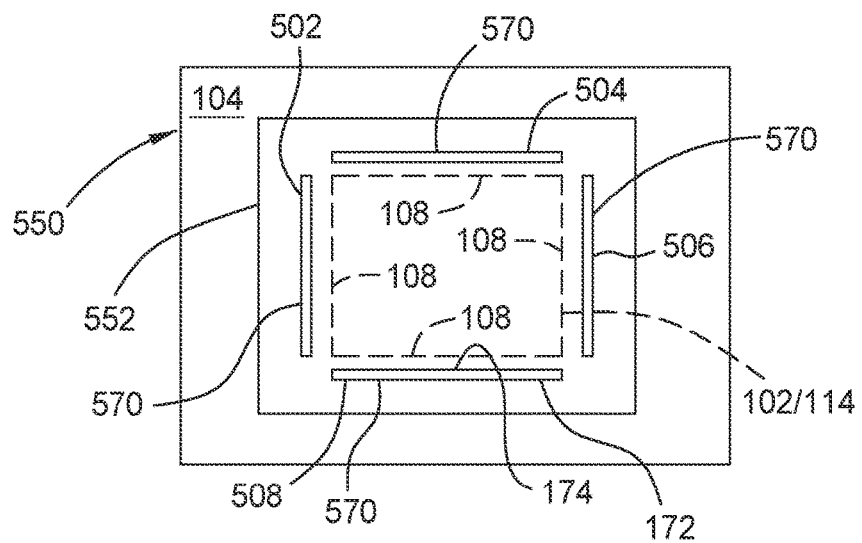
FIG. 5 is a bottom view of another embodiment of a lid that can be used in the integrated chip package of FIG. 1 illustrating an exemplary configuration of the gutter formed in the lid.

FIG. 5 is a bottom view of another embodiment of a lid 550 that can be used in the integrated chip package 100 of FIG. 1 illustrating an exemplary configuration of a gutter 570 formed in the lid 550. The gutter 570 may be formed on a single pad 452 extending from the bottom surface 162 of the lid 450 that accommodates one or more IC dies 114, or when a pad is not utilized, the gutter 570 may be formed on a planar bottom surface 162 of the lid 450. A single pad 452 and single IC die 114 are illustrated in FIG. 4.

The gutter 570 generally circumscribes one or more IC dies 114. Although only one IC die 114 is illustrated in FIG. 5, two or more IC dies 114 may be circumscribed by the gutter 570. Additionally, the gutter 570 may also be utilized in any of the lids 150 described above with reference to FIGS. 3-4.

Continuing to refer to FIG. 5, the gutter 570 is segmented into portions. In FIG. 5, the gutter 570 includes portions 502, 504, 506, 508, each of which is immediately adjacent and parallel to a respective one of the sidewalls 108 of the IC die 114. The portions 502, 504, 506, 508 of the gutter 570 do not intersect. The portions 502, 504, 506, 508 of the gutter 570 on opposite sides of the die overlapped region 102 are parallel to each other.

Although the gutter 570 is illustrated in FIG. 5 as having the inner sidewall 174 outward of the sidewall 108 of the IC die 114, the inner sidewall 174 may alternatively be disposed inward of the sidewall 108 while the outer sidewall 172 remains outward of the sidewall 108 of the IC die 114, such as shown in the enlargement of FIG. 1.

Figure 6:
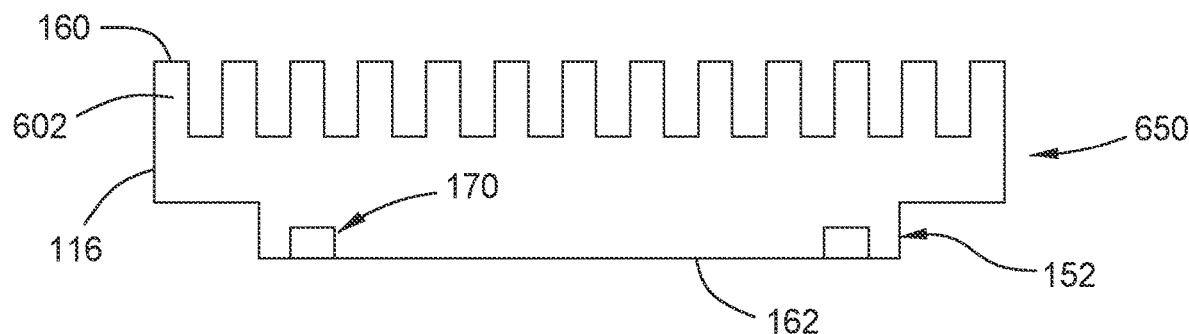
FIGS. 6-8 are schematic view of lids that can be used in the integrated chip package of FIG. 1 illustrating different heat transfer mechanisms.
Figure 7:
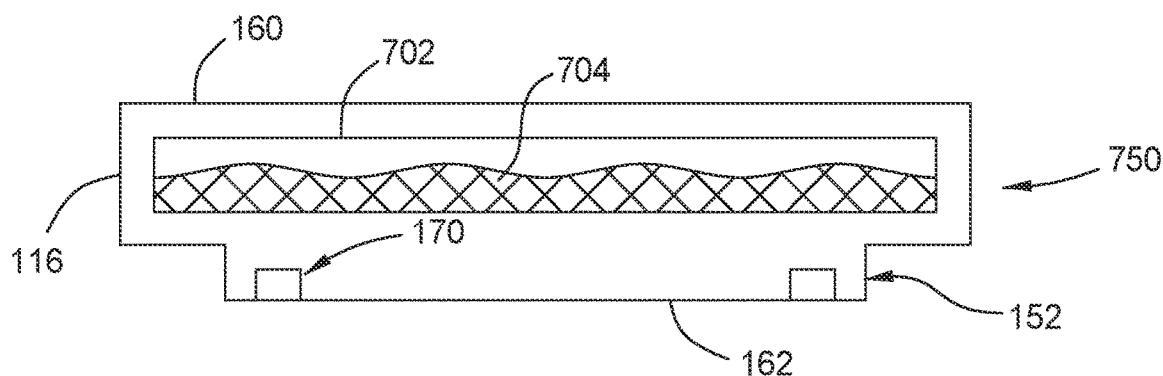
Figure 8:
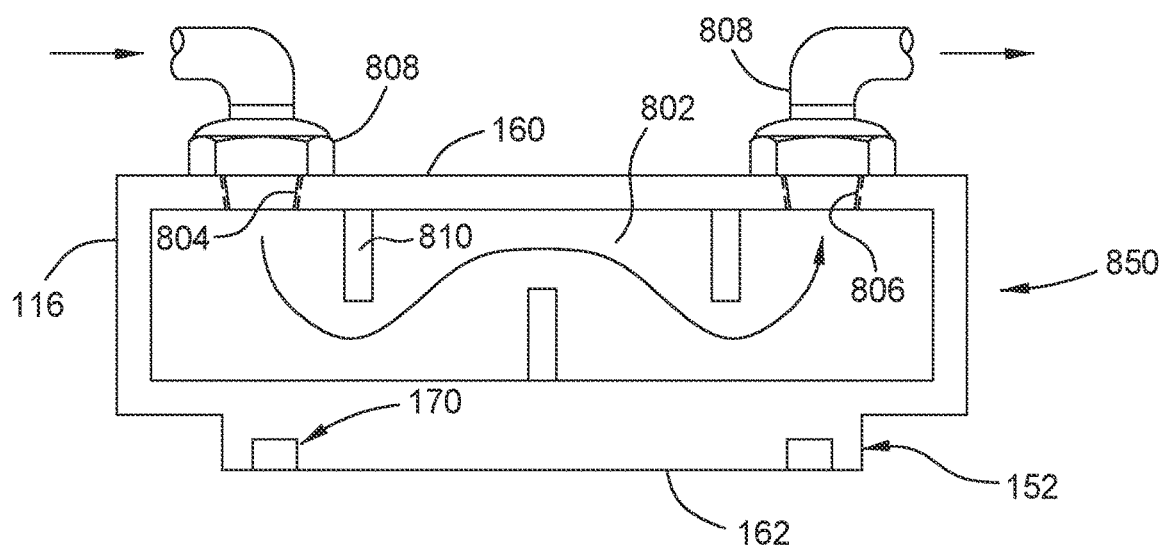

FIGS. 6-8 are schematic view of lids 650, 750, 850 that can be used in the integrated chip package 100 of FIG. 1 in place of the lids 150, 450, 550 illustrating different heat transfer mechanisms. One or more of the different heat transfer mechanisms shown in the lids 650, 750, 850 may be incorporated in any of the lids 150, 450, 550 and utilized in the integrated chip package 100 of FIG. 1. The lids 650, 750, 850 may optionally include one or more pads 152 and one or more gutters 170 formed on their bottom surfaces 162, such as described with reference to FIGS. 1-5 above. The gutters 170 may reside wholly outside of the die overlapped region 102, or have the outer sidewall 172 of the gutter 170 outside of the die overlapped region 102 and the inner sidewall within the die overlapped region 102.

Turning now to FIG. 6, the lid 650 includes heat transfer mechanisms in the form of fins 602. The fins 602 generally extend from the top surface 160 to promote the removal of heat from the lid 650, thus improving the removal of heat from the IC dies 114 of the chip package 100 (as shown in FIG. 1).

Alternatively, one or more or all the fins 602 may be replaced by a thermoelectric heat pump, such as a Peltier cooler.

In FIG. 7, the lid 750 includes a heat transfer mechanism in the form of an internal cavity 702. The cavity 702 has a phase change material 704 sealed therein. The phase change material 704 has a phase change temperature selected to promote heat transfer away from the IC dies 114 of the chip package 100 (as shown in FIG. 1).

In FIG. 8, the lid 850 includes heat transfer mechanism in the form of a forced-fluid heat transfer cavity 802. The heat transfer cavity 802 is formed in the lid 850 and includes an inlet port 804 and an outlet port 806. Each of the ports 804, 806 includes fittings 808 for connecting the heat transfer cavity 802 to a heat transfer fluid source (not shown) and a drain (also not shown). Heat transfer fluid flows from the source into the heat transfer cavity 802 through the inlet port 804 out the outlet port 806 to transfer heat away from the IC dies 114 of the chip package 100 (as shown in FIG. 1). The heat transfer cavity 802 may also include internal fins or baffles 810 to increase the resonance time of the fluid flowing through the cavity 802 and increase the surface area of the lid 850 in contact with the fluid to improve the efficiency of heat transfer from the lid 850 to the fluid.

Figure 9:
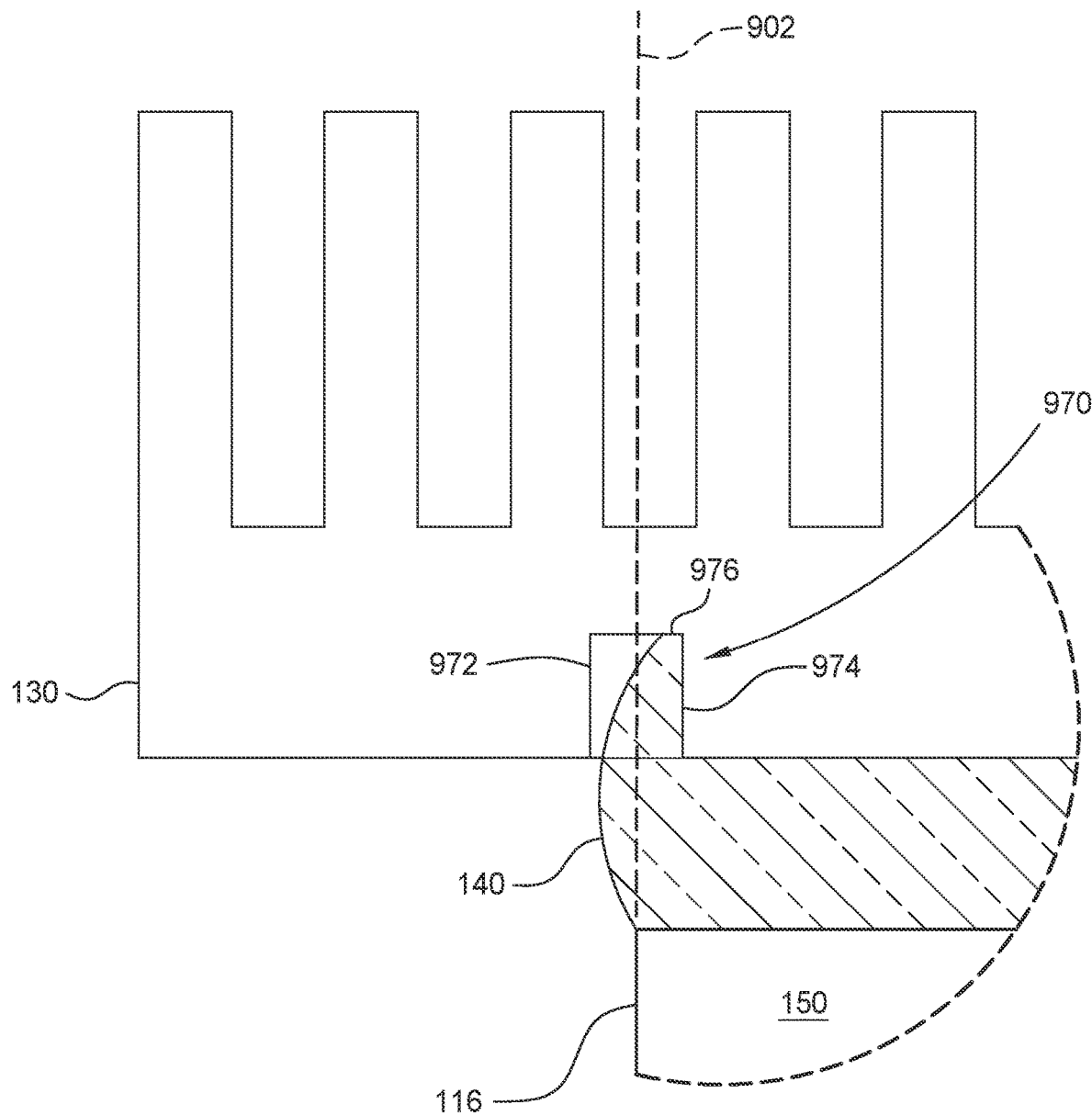
FIG. 9 is a partial sectional view of an interface between the lid and a heatsink of the integrated chip package of FIG. 1.

FIG. 9 a partial sectional view of an interface between the lid 150 and an optional heatsink 130 of the integrated chip package 100 of FIG. 1. The heatsink 130 may include any one or more of the different heat transfer mechanisms shown in the lids 650, 750, 850. The heatsink 130 is disposed over the lid 150. The heatsink 130 also extends beyond the outer sidewall 108 of the lid 150, as illustrated by imaginary line 902. TIM 140 is disposed between the lid 150 and heatsink 130 to enhance heat transfer therebetween. A bottom surface of the heatsink 130 facing the lid 150 includes a gutter 970 located to manage the control of TIM 140 that may be squeezed out from between the lid 150 and the heatsink 130. The gutter 970 includes an outer sidewall 972 coupled to an inner sidewall 974 by a bottom 976. The gutter 970 may reside wholly outward of the imaginary line 902 defined by the sidewall 108 of the lid 150, or have the outer sidewall 972 of the gutter 970 disposed outside of the imaginary line 902 and the inner sidewall 974 disposed over the lid 150.

Figure 10:
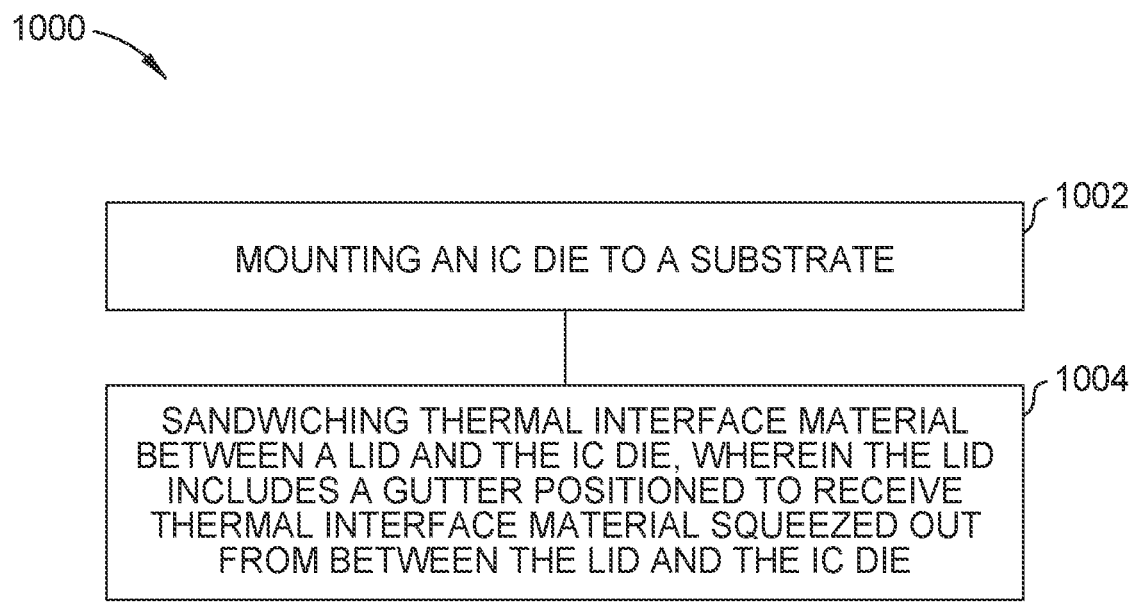
FIG. 10 is a block diagram of a method for fabricating an integrated chip package including one or more IC dies covered by a lid having a gutter for managing the spread of thermal interface material.

FIG. 10 is a block diagram of a method 1000 for fabricating an integrated chip package including one or more IC dies covered by a lid having a gutter for managing the spread of thermal interface material. The chip package, IC dies, lid and gutters may be configured as described above, or have another suitable configuration.

The method 1000 begins at operation 1002 by mounting an IC die to a substrate. The IC die may be mounted directly on a package substrate, or alternatively, first mounted on an interposer prior to the interposer and IC die being mounted on the package substrate. In one example, the IC die is mounted to the substrate using solder connections.

At operation 1004, thermal interface material (TIM) is sandwiched between a lid and the IC die that is mounted to the package substrate. When sandwiching the TIM between the lid and the IC die, the TIM generally spreads out between the facing surfaces of the lid and the IC die as the TIM is compressed. Some TIM may be extruded out from between the lid and the IC die.

Advantageously, the lid includes a gutter positioned to receive TIM squeezed out from between the lid and the IC die, thus substantially reducing the possibility that some extruded TIM may fall or otherwise find a location within the chip package or other nearby device when the extruded TIM could become a contaminant or electrical short.

The chip package described above advantageously provides excellent heat transfer between a lid and a IC die of the chip package, while containing TIM to the desired region of between the lid and IC die through the use of one or more TIM receiving gutters formed on the bottom surface of the lid. The gutter beneficially reduces the probability of TIM coming in contact with the PCB to which the chip package is mounted or other ground, power or signal carrying conductors within the chip package. The gutter helps reduce the spread of TIM from outside of desired areas (i.e., the area between the lid and the IC die) by granting room for the TIM expand as the containing assemblies are compressed and/or when the TIM is heated during use or through exposure to hot ambient environments. As the gutter is cost effective to implement and doesn't require precise TIM application, careful and costly post time TIM deposition manual clean up procedures are substantially eliminated. Additionally, since there is essentially no impact to the fabrication cost of the lid, but large assembly and clean-up cost rejections, the overall fabrication cost of the chip package is reduced. As a result, the chip package has increased reliability while being less expensive to fabricate.

While the foregoing is directed to embodiments of the present disclosure, other and further embodiments may be devised without departing from the basic scope thereof, and the scope thereof is determined by the claims that follow.

What is claimed is:

1. A chip package, comprising:
a substrate;
a first IC die coupled to the substrate, the first IC die having a top surface bounded by edges; and
a lid having a top surface and a bottom surface, the bottom surface facing away from the top surface and towards the first IC die, the bottom surface of the lid having a first die overlapped region facing a top surface of the first IC die, the bottom surface of the lid having a first gutter formed therein, at least a portion of the first gutter aligned in a common direction with at least one of the edges of the top surface of the first IC die, and an outer sidewall of the first gutter formed outward of the first die overlapped region, the lid having a first pad extending away from the top surface of the lid, the first gutter formed in the first pad, the first pad comprising a plurality of grooves, and wherein the first gutter has a depth that is at least an order of magnitude greater than a depth of the plurality of grooves.

2. The chip package of claim 1, wherein the first gutter circumscribes the first die overlapped region.

3. The chip package of claim 1 further comprising:
a second IC die coupled to the substrate next to the first IC die, the second IC die having a top surface bounded by edges, wherein the top surface of the second IC die faces a second die overlapped region defined on a bottom surface of the lid.

4. The chip package of claim 3, wherein the first gutter formed in the bottom surface of the lid circumscribes both the first IC die and the second IC die.

5. The chip package of claim 3, wherein the bottom surface of the lid further comprises:
a second pad extending away from the top surface of the lid; and
a second gutter formed in the second pad, at least a portion of the second gutter aligned in a common direction with at least one of the edges of the top surface of the second IC die, and an outer sidewall of the second gutter formed outward of the second die overlapped region.

6. The chip package of claim 3, wherein the bottom surface of the lid further comprises:
a second gutter having at least a portion of the second gutter aligned in a common direction with at least one of the edges of the top surface of the second IC die, and an outer sidewall of the second gutter formed outward of the second die overlapped region, a portion of the first and second gutters passing between the first and second die overlapped regions.

7. The chip package of claim 1, wherein the first gutter circumscribes the first die overlapped region.

8. The chip package of claim 1, wherein the first gutter is entirely disposed outward of the first die overlapped region.

9. The chip package of claim 1, wherein an inner sidewall of the first gutter is formed inside the first die overlapped region.

10. The chip package of 1, wherein the lid further comprises:

a cavity defined in the lid configured to contain a phase change material or flow fluid therethrough.

11. The chip package of 1, wherein the top surface of the lid further comprises:
a plurality of heat transfer fins.

12. A chip package, comprising:
a substrate;
a first IC die coupled to the substrate, the first IC die having a top surface bounded by edges; and
a lid having a top surface and a bottom surface, the bottom surface facing away from the top surface and towards the first IC die, the bottom surface of the lid having a first gutter and a plurality of grooves formed therein, the first gutter has a depth that is at least an order of magnitude greater than a depth of the plurality of grooves, an outer sidewall of the first gutter formed outward of a first die overlapped region.

13. The chip package of 12, wherein the lid further comprises:
a pad extending away from the top surface of the lid, the first gutter and the plurality of grooves formed in the pad, the pad disposed directly over the first IC die.

14. The chip package of 12, wherein the lid further comprises one or more heat transfer mechanisms selected from the group consisting of:
(a) phase change material disposed in a cavity defined in the lid; (b) a plurality of heat transfer fins; (c) thermoelectric heat pump; (d) a forced fluid heat exchanger; and (e) a heat pipe.

15. A chip package, comprising:
a substrate;
a first IC die coupled to the substrate, the first IC die having a top surface bounded by edges; and
a lid having a top surface and a bottom surface, the bottom surface facing away from the top surface and towards the first IC die, the bottom surface of the lid having a first die overlapped region facing a top surface of the first IC die, the bottom surface of the lid having a first gutter formed therein, at least a portion of the first gutter aligned in a common direction with at least one of the edges of the top surface of the first IC die, and an outer sidewall of the first gutter formed outward of the first die overlapped region; and
a second IC die coupled to the substrate next to the first IC die, the second IC die having a top surface bounded by edges, wherein the top surface of the second IC die faces a second die overlapped region defined on a bottom surface of the lid, wherein the bottom surface of the lid further comprises:
a second gutter having at least a portion of the second gutter aligned in a common direction with at least one of the edges of the top surface of the second IC die, and an outer sidewall of the second gutter formed outward of the second die overlapped region, a portion of the first and second gutters passing between the first and second die overlapped regions.

16. The chip package of claim 15, wherein the first gutter circumscribes the first die overlapped region.

17. The chip package of claim 15, wherein the first gutter formed in the bottom surface of the lid circumscribes both the first IC die and the second IC die.

18. The chip package of claim 17, wherein the bottom surface of the lid further comprises:
a first pad extending away from the top surface of the lid, the first gutter formed in the first pad.

19. The chip package of claim 18, wherein the bottom surface of the lid further comprises:
a second pad extending away from the top surface of the lid; and wherein the second gutter is formed in the second pad, at least a portion of the second gutter aligned in a common direction with at least one of the edges of the top surface of the second IC die, and an outer sidewall of the second gutter formed outward of the second die overlapped region.

20. The chip package of claim 15, wherein the first gutter circumscribes the first die overlapped region.

21. The chip package of claim 15, wherein the first gutter is entirely disposed outward of the first die overlapped region.

22. The chip package of claim 15, wherein an inner sidewall of the first gutter is formed inside the first die overlapped region.

23. The chip package of claim 15, the lid having a pad extending away from the top surface of the lid, the first gutter formed in the pad, the pad comprising a plurality of grooves, and wherein the first gutter has a depth that is at least an order of magnitude greater than a depth of the plurality of grooves.

* * * * *